United States Patent [19]

Gutekunst

[11] Patent Number: 5,093,844
[45] Date of Patent: Mar. 3, 1992

[54] PULSE-SPACING DECODER

[75] Inventor: Jürgen Gutekunst, Nürtingen, Fed. Rep. of Germany

[73] Assignee: Standard Elektrik Lorenz Aktiengesellschaft, Stuttgart, Fed. Rep. of Germany

[21] Appl. No.: 480,053

[22] Filed: Feb. 14, 1990

[30] Foreign Application Priority Data

Mar. 3, 1989 [DE] Fed. Rep. of Germany ....... 3906706

[51] Int. Cl.$^5$ .............................................. H03K 9/08
[52] U.S. Cl. .................................. 375/23; 342/46; 329/313
[58] Field of Search ........... 375/23; 340/825.6, 825.63, 340/825.64, 825.68, 825.69; 329/311, 312, 313; 342/46, 47

[56] References Cited

U.S. PATENT DOCUMENTS

| | | | |
|---|---|---|---|
| 3,984,807 | 10/1976 | Haemmig | 375/23 |
| 4,027,276 | 5/1977 | Shaughnessy | 375/23 |
| 4,242,664 | 12/1980 | Lindstedt et al. | 340/825.63 |
| 4,430,652 | 2/1984 | Rothenbuhler et al. | 340/825.64 |
| 4,627,075 | 12/1986 | Fleming, III et al. | 375/23 |
| 4,768,207 | 8/1988 | Sejourne et al. | 375/23 |

FOREIGN PATENT DOCUMENTS

| | | |
|---|---|---|
| 1762007 | 3/1971 | Fed. Rep. of Germany . |
| 2350198 | 1/1976 | Fed. Rep. of Germany . |
| 2549967 | 2/1985 | France . |
| 1158759 | 7/1969 | United Kingdom . |

OTHER PUBLICATIONS

Patent Abstract of Japan, vol. 5, No. 70, May 12, 1981, JP 5619226, Mitsubishi Denki K.K.

E. Kramer, "Funksysteme für Ortung und Navigation" [Radio Position Finding and Navigation Systems] Published: Berliner Union GmbH, Stuttgart, 1973, pp. 147–159.

*Primary Examiner*—Douglas W. Olms
*Assistant Examiner*—Ralph Smith
*Attorney, Agent, or Firm*—Spencer & Frank

[57] ABSTRACT

A circuit for filtering pulse sequences of a given frequency out of a composite signal includes a series combination of a monostable multivibrator (MF) and a random-access memory (RAM), an address register and a clock. The monostable multivibrator (MF) serves as a pulse shaper of incoming signals. The input ($D_E$) and output ($D_A$) of the random-access memory (RAM) are connected to the inputs of an AND gate (UG). An address counter register (AR) associated with the random-access memory (RAM) has a count cycle whose duration is equal to the pulse spacing of the sequence to be recognized. During each clock period (T2), the current signal state of the input ($D_E$) of the random-access memory (RAM) and the content of the addressed memory cell are checked for equality by the AND gate (UG) and the current signal state is then written into the cell.

5 Claims, 3 Drawing Sheets

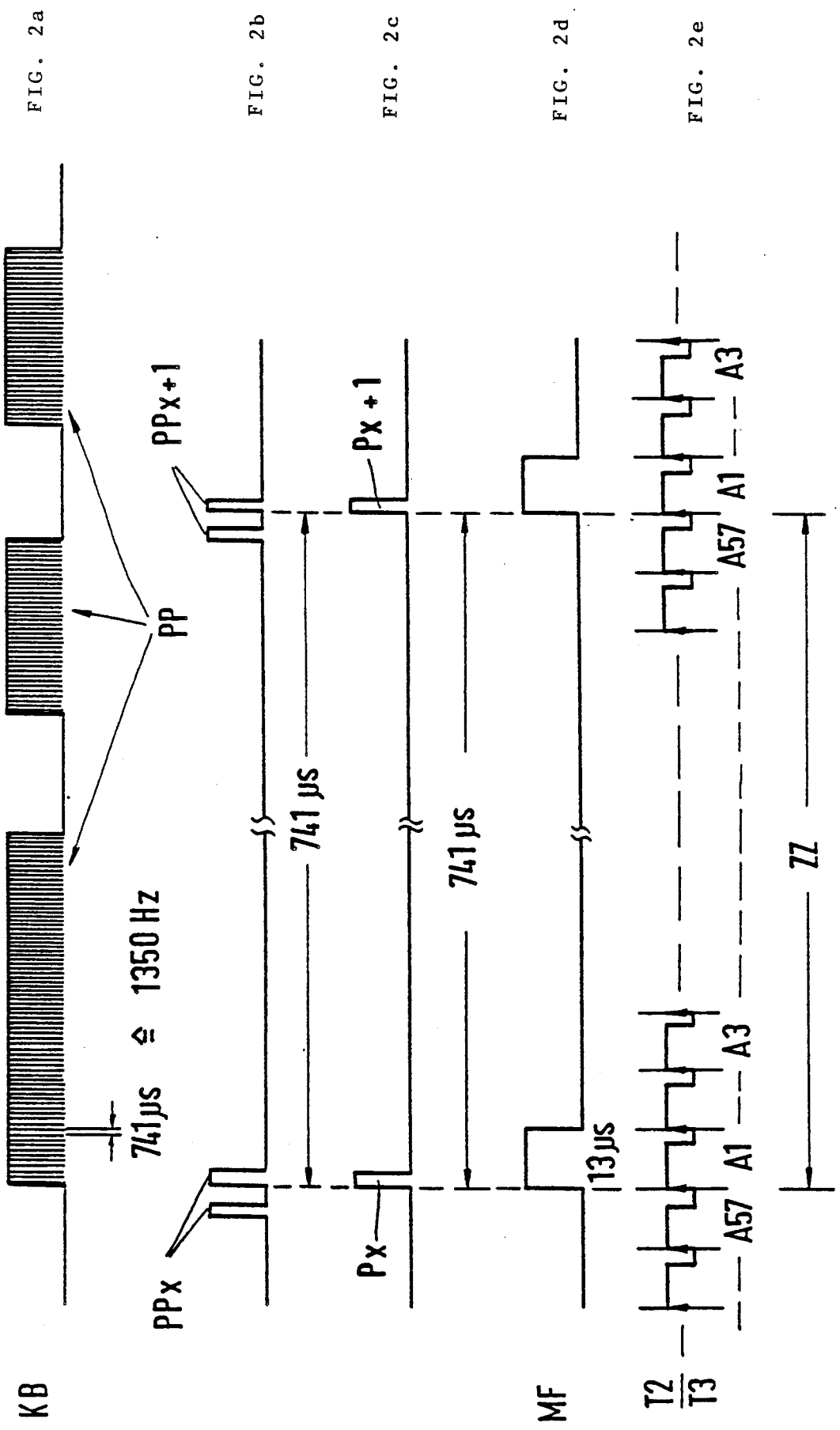

PULSE-SPACING DECODER

BACKGROUND OF THE INVENTION

The present invention relates to a circuit arrangement for decoding pulse spacings preferably, for filtering pulse sequences with a given spacing therebetween out of a composite signal.

In radio navigation systems, particularly in air navigation DME (Distance Measuring Equipment) systems, pulse sequences are generated which must be filtered out of a composite signal by a ground station and/or an airborne station for checking or evaluation purposes (E. Kramer, "Funksysteme für Ortung und Navigation", Verlag Berliner Union GmbH, Stuttgart, 1973, pages 147 to 157 ["Radio Position Finding and Navigation Systems", Publisher: Berliner Union GmbH].

The ground stations transmit at predetermined time intervals an identification signal which consists of a train of pulse pairs in Morse code. After decoding, the identification pulses form a periodic pulse sequence of 1350 Hz. The code can thus be made audible for the pilot and for the personnel of the ground station.

So far, it has not been customary to monitor transmitted identification signals for completeness at the ground station. Only occasional acoustic checks of the audible Morse code have been made by personnel of the ground station. The selection of identification signals from composite signals received from the transmitter has been made by a correlator consisting of an input shift register, a reference register, and a suitable number of comparators. With a justifiable amount of circuitry, the resolution attainable with such an arrangement is limited.

To measure the slant distance between aircraft and a ground station, the airborne station transmits a pair of pulses which are acknowledged by the ground station by a pair of time-shifted reply pulses. The time interval between the two pulses is the channel identification. The latter must be recognized both by the ground station and by the airborne station. So far, a delay line has been used for this purpose which provides a delay equal to the time interval between the pulses. The accuracy achievable with such a delay line is not sufficient, however.

SUMMARY OF THE INVENTION

It is, therefore, an object of the invention to provide a circuit arrangement which permits accurate checking of pulse spacings.

This object is attained by a circuit arrangement comprising the series combination of a pulse shaper and a random-access memory; clock means for generating count clock periods indicative of the reading or writing of contents of the random-access memory; an address counter register for addressing respective cells of the random-access memory and having a count cycle; and an AND gate, the input and output of the random-access memory being respectively connected to the two inputs of the AND gate, wherein the pulse shaper receives incoming pulse signals and the length of the count cycle of the address counter register is equal to a predetermined spacing between two consecutive pulse pairs, such that during each count clock period, contents of the respective addressed cell of the random-access memory are read out and the current signal state received from the pulse shaper at the input of the random-access memory is written into the same cell, and that pairs of consecutive pulses with the predetermined spacing therebetween form the output signal of the circuit which can be taken from the output of the AND gate. Further advantageous features of the invention are the pulse shaper has a dwell time equal to the count clock period which modifies the shape of incoming pulses and the repetition frequency of count pulses in a clock period is in the MHz range. Additionally, the length of the count cycle is adjustable.

The principal advantages offered by the invention are that the use of a random-access read/write memory with a great number of cells permits optimum resolution and, thus, very accurate checking of the pulse spacings, and that the circuit complexity and space requirement are comparatively low.

BRIEF DESCRIPTION OF THE DRAWINGS

The invention will be better understood by reference to the description of exemplary applications taken in conjunction with the accompanying drawings, in which:

FIGS. 2a–2e show the timing diagram for a first application, and

DETAILED DESCRIPTION OF THE PREFERRED EMBODIMENTS

Figure 1:
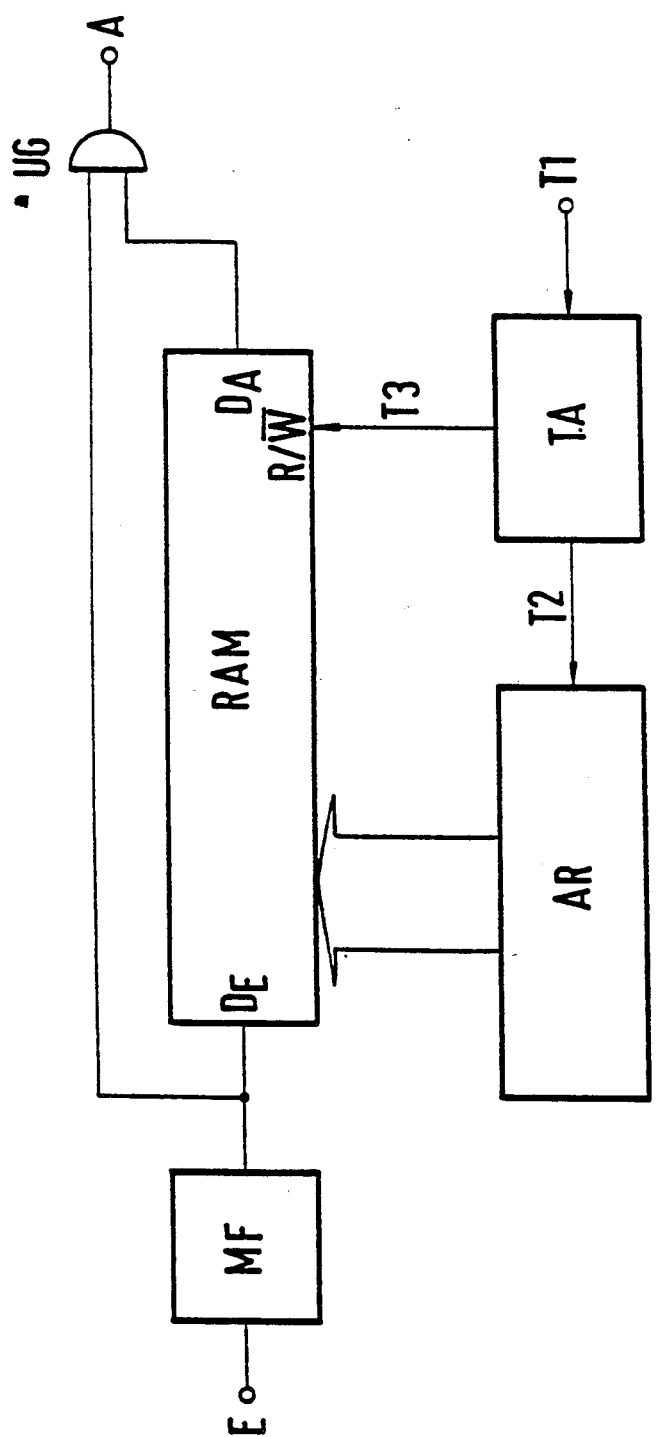
FIG. 1 is a block diagram of a circuit arrangement in accordance with the invention.
Figures 3A, 3B, 3C, 3D:
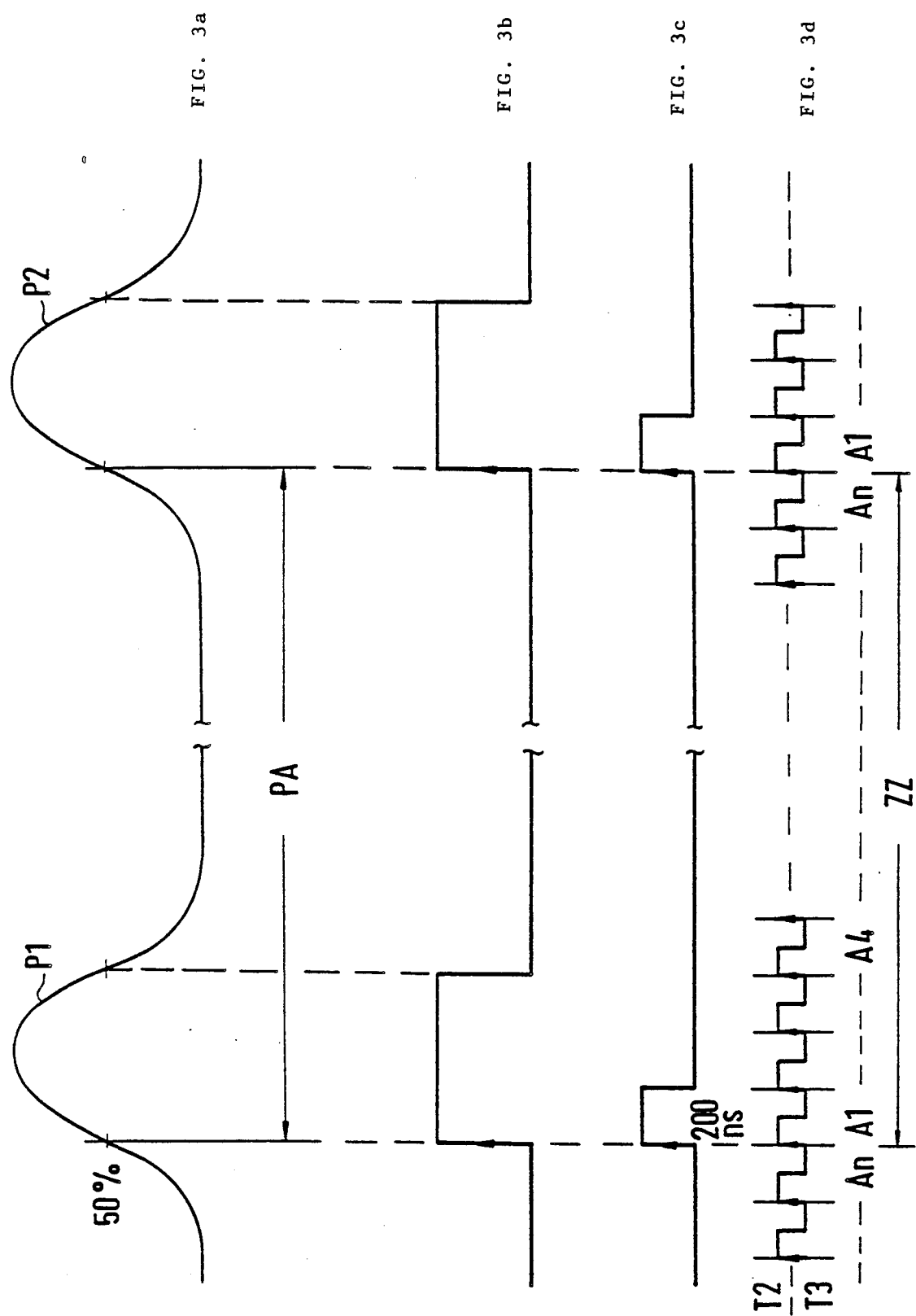
FIGS. 3a–3d show the timing diagram for a second application.

The pulse-spacing-decoding circuit shown in FIG. 1 consists of the series combination of a monostable multivibrator MF and a random-access memory RAM, an AND gate UG whose two inputs are connected to the input $D_E$ and the output $D_A$, respectively, of the random-access memory RAM, an address counter register AR associated with the random-access memory RAM, a clock conditioner TA, and a generator (not shown) providing a basic clock signal T1. The clock conditioner TA derives from the basic clock signal T1 count pulses T2 by which the address count register AR is incremented. The length of the count cycle ZZ (FIGS. 2 and 3) can be adjusted depending on the specific application. A read/write input R/$\overline{W}$ of the random-access memory RAM is fed with read/write pulses T3 which are produced by the clock conditioner TA in synchronism with the counting pulses T2. In the second half of each T3 clock period, a change of state of the signal at the input R/$\overline{W}$ causes the signal applied at the input $D_E$ of the random-access memory RAM to be written into the addressed cell, whose content was previously read out via the output $D_A$. During the "read" portion of the clock period, the current input signal and the signal stored in the re-addressed cell during the preceding count cycle ZZ (FIGS. 2 and 3) are applied to the AND gate UG. When both inputs of the AND gate are at logic 1, the AND gate is enabled. The change of state at the output A indicates that two pulses with the predetermined spacing were recognized. The monostable multivibrator MF connected ahead of the random-access memory RAM serves as a pulse shaper. Its dwell time is equal to the clock period T2.

FIGS. 2a–2e illustrate an identification signal KB of a ground station in the DME system and the timing diagram for recognizing this identification signal with the circuit of FIG. 1. The identification signal KB consists of a 3-letter Morse code (shown only in part) (FIG. 2a).

The pulses of the Morse code are formed from a plurality of periodic pulse pairs PP with a repetition rate of 1350 Hz (FIG. 2b). The identification signal KB, transmitted at 40-ms intervals, is contained in a composite signal derived from transmitter noise and consisting of randomly distributed pulses. Via the criterion of the pair of pulses PP recurring at a rate of 1350 Hz (FIG. 2b), the identification signal KB can be filtered out of the composite signal with the aid of the circuit arrangement of FIG. 1.

The pulses decoded as described above are applied to the input E of the circuit of FIG. 1. They are conditioned in the monostable multivibrator MF, whose dwell time is equal to the clock period T2, here 13 $\mu$s (FIG. 2d). The duration of the count cycle ZZ of the address counter register AR is equal to the pulse spacing to be recognized. Only pulses whose spacing is equal to this cycle duration ZZ are recognized as such. The circuit of FIG. 1 thus acts like an extremely sharp-cutting filter.

FIG. 2c shows two periodic pulses Px and Px+1, which are derived from the pulse pairs PPx and PPx+1 (FIG. 2b) by decoding. As their repetition rate is 1350 Hz, the time interval between them is 741 $\mu$s. To this interval, the count cycle ZZ with fifty-seven 13-$\mu$s clock periods T2 is adjusted. As mentioned above, each pulse appearing at the input E is brought to the duration of 13 $\mu$s (FIG. 2d) by the monostable multivibrator MF. This is necessary in order to always have the same conditions during the subsequent processing. As the incoming pulses and the count pulses T2 are not in synchronism, the synchronism between the monostable-multivibrator pulses and the addressing of a memory cell, shown in FIGS. 2a-2e for the sake of simplicity, will occur rarely. It is irrelevant, however, whether the count pulses T2 lead or lag the respective monostable-multivibrator pulses, because the pulses following after a cycle duration ZZ are sampled under the same conditions and, therefore, have the same form. It is equally irrelevant in which of the cells A1 to A57 of the random-access memory RAM a signal state was stored, because the cycle ZZ remains the same, so that a pulse occurring after the predetermined cycle duration will be up for evaluation at the moment the corresponding cell is addressed again. FIGS. 2c to 2e illustrate this. The first periodic pulse Px is changed by the monostable multivibrator MF into a pulse which is presented to the input $D_E$ of the random-access memory RAM for 13 $\mu$s. During this time, the content of the addressed cell, here A1, is read out. Let us assume that the cell A1 is empty, so that the AND condition for the AND gate UG is not satisfied. In the last third of the clock period T2, the current signal state at the input $D_E$ is written into the cell A1 via the change of state of the read/write signal T3. At the beginning of the next count cycle ZZ, the next periodic pulse Px+1 appears. At the same time, the cell A1 is addressed again. The content of the latter is now equal to the logic level at the input $D_E$, so that the AND condition for the AND gate UG is satisfied. During the subsequent "write" portion of the clock period, the current signal state is again written into the cell A1. Thus it is ensured that pulses with only slightly different spacings are suppressed. Depending on the capacity of the random-access memory RAM, the resolution can be varied within wide limits if necessary.

FIGS. 3a-3d show the timing diagram if the circuit arrangement of FIG. 1 is used to decode the spacing PA between the single pulses P1 and P2 of a pulse pair DP of the kind identified in the Background of the Invention.

The received pulse pair DP is digitized by a 50% Schmitt trigger ST and then applied to the input E of the circuit of FIG. 1. As in the previous example, the shape of the pulse pair is changed by the monostable multivibrator MF. At a clock rate of 5 MHz, for example, the clock period and, thus, the dwell time of the monostable multivibrator MF are 200 ns. Here, too, the count-cycle duration ZZ of the address counter register AR is equal to the pulse spacing PA to be recognized. The cyclic read/write operation of the successively addressed memory cells A1 to An is performed essentially as described above. Here, too, a signal appears at the output A of the circuit arrangement of FIG. 1 if the addressed memory cell and the signal at the input $D_E$ of the random-access memory RAM are at logic 1 at an interval equal to the count-cycle duration ZZ. The extremely high resolution of 200 ns ensures that pulse pairs with a spacing differing by more than 200 ns are reliably excluded.

I claim:

1. Circuit arrangement for decoding pulse spacings between incoming pulse signals, particularly for navigation systems, comprising: the series combination of a pulse shaper and a random-access memory having a plurality of cells; clock means for generating count clock periods indicative of the reading or writing of cell contents; address counter register means for addressing cells of the random-access memory and having a count cycle of count clock periods; and an AND gate, the input and output of the random-access memory being respectively connected to the two inputs of the AND gate, wherein the length of the count cycle of the address counter register means is equal to a spacing between two consecutive incoming pulse signals with a predetermined spacing, and that during each count clock period, contents of the addressed cell of the random-access memory are read out and the current signal state received from the pulse shaper at the input of the random-access memory is written into the same cell, such that pulse signals with the predetermined spacing therebetween are decoded and form the output signal of the circuit which can be taken from the output of the AND gate.

2. A circuit arrangement as claimed in claim 1, wherein the pulse shaper is a monostable multi-vibrator having a dwell time equal to the count clock period.

3. A circuit arrangement as claimed in claim 1, wherein the count clock period has count pulses with a repetition frequency in the MHz range.

4. A circuit arrangement as claimed in claim 1, wherein the length of the count cycle of the address counter register means is adjustable.

5. Circuit arrangement for filtering out consecutive pairs of pulses with a predetermined spacing therebetween from an incoming composite signal, comprising:
pulse shaping means for receiving pulses of incoming signals and outputting modified pulse signals;
a random-access memory having a plurality of cells for storing inputted pulse signals, an input of the random-access memory being connected to the output of the pulse shaping means;
clock means for generating count clock periods, each clock period generates a read and write signals;
register means for addressing cells of the random-access memory in response to a count cycle of count clock periods; and an AND gate, the input and output of the random-access memory being respectively connected to the two inputs of the AND gate, wherein the count cycle of clock periods has a duration equal to the predetermined spacing of consecutive pulses to be filtered, and that during each clock period, the content of the addressed cell of the random-access memory is outputted in response to the read signal and the signal output from the pulse shaper is written into the same cell in response to the write signal, such that the AND gate outputs the decoded pulses with the predetermined spacing therebetween.

* * * * *